(12) United States Patent
Miks et al.

(10) Patent No.: US 6,919,620 B1
(45) Date of Patent: Jul. 19, 2005

(54) COMPACT FLASH MEMORY CARD WITH CLAMSHELL LEADFRAME

(75) Inventors: Jeffrey Alan Miks, Chandler, AZ (US); David Roman, Tempe, AZ (US); John A. Miranda, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 239 days.

(21) Appl. No.: 10/245,071

(22) Filed: Sep. 17, 2002

(51) Int. Cl.[7] .............................................. H01L 23/495
(52) U.S. Cl. .................. 257/666; 257/692; 257/787
(58) Field of Search ................................ 257/666, 669, 257/672, 676, 692, 782, 784, 787

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,189,342 A | 2/1980 | Kock |
| 4,289,922 A | 9/1981 | Devlin |
| 4,301,464 A | 11/1981 | Otsuki et al. |
| 4,417,266 A | 11/1983 | Grabbe |
| 4,530,152 A | 7/1985 | Roche et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,907,067 A | 3/1990 | Derryberry |
| 4,920,074 A | 4/1990 | Shimizu et al. |
| 4,935,803 A | 6/1990 | Kalfus et al. |
| 4,987,475 A | 1/1991 | Schlesinger et al. |
| 5,029,386 A | 7/1991 | Chao et al. |
| 5,041,902 A | 8/1991 | McShane |
| 5,065,223 A | 11/1991 | Matsuki et al. |

(Continued)

FOREIGN PATENT DOCUMENTS

| | | |
|---|---|---|
| DE | 19734794 A1 | 8/1997 |
| EP | 54021117 | 6/1979 |

(Continued)

OTHER PUBLICATIONS

JEDEC Solid State Product Outline, "2 Lead Header Family Surface Mounted (Peripheral Terminals)", 4 pages.
Mannion, P., "MOSFETs Break Out of the Shackles of Wirebonding", Electronic Design, vol. 47, #6 (Mar. 22, 1999).
Micro Electronics Packaging Handbook, 1989, edited by R. Tummala & E. Rymaszewski, published by Van Nostrand Reinhold. NewYork, NY.
Vishay Siliconix Press Release, http://www.siliconix.com/www/200/pr98/4430.html, Dec. 9, 1998, pp. 1–3.

*Primary Examiner*—Phuc T. Dang
(74) *Attorney, Agent, or Firm*—Stetina Brunda Garred & Brucker

(57) ABSTRACT

A memory card comprising a leadframe which includes a main frame defining a peripheral side. Extending toward the peripheral side of the main frame is a first set of leads, while extending away from the peripheral side is a second set of leads which are disposed in juxtaposed relation to respective ones of the leads of the first set. Positioned upon the main frame and electrically connected to the leads of the first and second sets is an electrical subassembly. A package body at least partially encapsulates the leadframe and the electrical subassembly. Portions of the leads of the first and second sets are exposed within the package body and mimic the structural and functional attributes of the fifty pin connector of a conventional CF card.

22 Claims, 9 Drawing Sheets

U.S. PATENT DOCUMENTS

| | | |
|---|---|---|
| 5,070,039 A | 12/1991 | Johnson et al. |
| 5,087,961 A | 2/1992 | Long et al. |
| 5,096,852 A | 3/1992 | Hobson |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,454,905 A | 10/1995 | Fogelson |
| 5,474,958 A | 12/1995 | Djennas et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasarathi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,102 A * | 10/1998 | Rostoker .................. 257/666 |
| 5,818,105 A | 10/1998 | Kouda |
| 5,821,457 A | 10/1998 | Mosley et al. |
| 5,821,615 A | 10/1998 | Lee |
| 5,835,988 A | 11/1998 | Ishii |
| 5,844,306 A | 12/1998 | Fujita et al. |
| 5,859,471 A | 1/1999 | Kuraishi et al. |
| 5,866,939 A | 2/1999 | Shin et al. |
| 5,874,784 A | 2/1999 | Aoki et al. |
| 5,877,043 A | 3/1999 | Alcoe et al. |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,945,731 A * | 8/1999 | Iino ........................ 257/672 |
| 5,951,305 A | 9/1999 | Haba |
| 5,959,356 A | 9/1999 | Oh |
| 5,973,388 A | 10/1999 | Chew et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,087,722 A | 7/2000 | Lee et al. |
| 6,100,594 A | 8/2000 | Fukui et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |

| | | | | | | |
|---|---|---|---|---|---|---|
| 6,225,146 B1 | 5/2001 | Yamaguchi et al. | EP | 0720234 | 3/1996 | |
| 6,229,200 B1 | 5/2001 | Mclellan et al. | EP | 0794572 A2 | 10/1997 | |
| 6,229,205 B1 | 5/2001 | Jeong et al. | EP | 0936671 | 8/1999 | |
| 6,239,384 B1 | 5/2001 | Smith et al. | JP | 55163868 | 12/1980 | |
| 6,242,281 B1 | 6/2001 | Mclellan et al. | JP | 5745959 | 3/1982 | |
| 6,256,200 B1 | 7/2001 | Lam et al. | JP | 58160095 | 8/1983 | |
| 6,281,566 B1 | 8/2001 | Magni | JP | 59208756 | 11/1984 | |
| 6,281,568 B1 | 8/2001 | Glenn et al. | JP | 59227143 | 12/1984 | |
| 6,282,095 B1 | 8/2001 | Houghton et al. | JP | 60116239 | 8/1985 | |
| 6,285,075 B1 | 9/2001 | Combs et al. | JP | 60195957 | 10/1985 | |
| 6,291,273 B1 | 9/2001 | Miyaki et al. | JP | 60231349 | 11/1985 | |
| 6,294,100 B1 | 9/2001 | Fan et al. | JP | 6139555 | 2/1986 | |
| 6,294,830 B1 | 9/2001 | Fjelstad | JP | 629639 | 1/1987 | |
| 6,297,548 B1 | 10/2001 | Moden et al. | JP | 63205935 | 8/1988 | |
| 6,303,984 B1 | 10/2001 | Corisis | JP | 63233555 | 9/1988 | |
| 6,316,838 B1 | 11/2001 | Ozawa et al. | JP | 63249345 | 10/1988 | |
| 6,323,550 B1 | 11/2001 | Martin et al. | JP | 63316470 | 12/1988 | |
| 6,326,244 B1 | 12/2001 | Brooks et al. | JP | 64054749 | 3/1989 | |
| 6,339,255 B1 | 1/2002 | Shin | JP | 1106456 | 4/1989 | |
| 6,353,265 B1 * | 3/2002 | Michii .................. 257/777 | JP | 4098864 | 3/1992 | |
| 6,355,502 B1 | 3/2002 | Kang et al. | JP | 5166992 | 7/1993 | |
| 6,376,283 B1 | 4/2002 | Chen .................. 438/124 | JP | 5283460 | 10/1993 | |
| 6,380,048 B1 | 4/2002 | Boon et al. | JP | 6092076 | 4/1994 | |
| 6,384,472 B1 | 5/2002 | Huang | JP | 7297344 | 11/1995 | |
| 6,395,578 B1 | 5/2002 | Shin et al. | JP | 7312405 | 11/1995 | |
| 6,400,004 B1 | 6/2002 | Fan et al. | JP | 864634 | 3/1996 | |
| 6,444,499 B1 | 9/2002 | Swiss et al. | JP | 8125066 | 5/1996 | |
| 6,452,279 B2 | 9/2002 | Shimoda | JP | 8306853 | 11/1996 | |
| 6,464,121 B2 | 10/2002 | Reijnders | JP | 98205 | 1/1997 | |
| 6,624,005 B1 | 9/2003 | DiCaprio et al. | JP | 98206 | 1/1997 | |
| 2001/0008305 A1 | 7/2001 | McLellan et al. | JP | 98207 | 1/1997 | |
| 2002/0011654 A1 | 1/2002 | Kimura | JP | 992775 | 4/1997 | |
| 2002/0024122 A1 | 2/2002 | Jung et al. | JP | 9293822 | 11/1997 | |
| 2002/0140061 A1 | 10/2002 | Lee | JP | 10256240 | 9/1998 | |
| 2002/0140068 A1 | 10/2002 | Lee et al. ............. 257/676 | KR | 941979 | 1/1994 | |
| | | | KR | 199772358 | 11/1997 | |
| | FOREIGN PATENT DOCUMENTS | | KR | 100220154 | 6/1999 | |
| EP | 59050939 | 3/1984 | WO | 9956316 | 11/1999 | |
| EP | 0720225 | 3/1996 | * cited by examiner | | | |

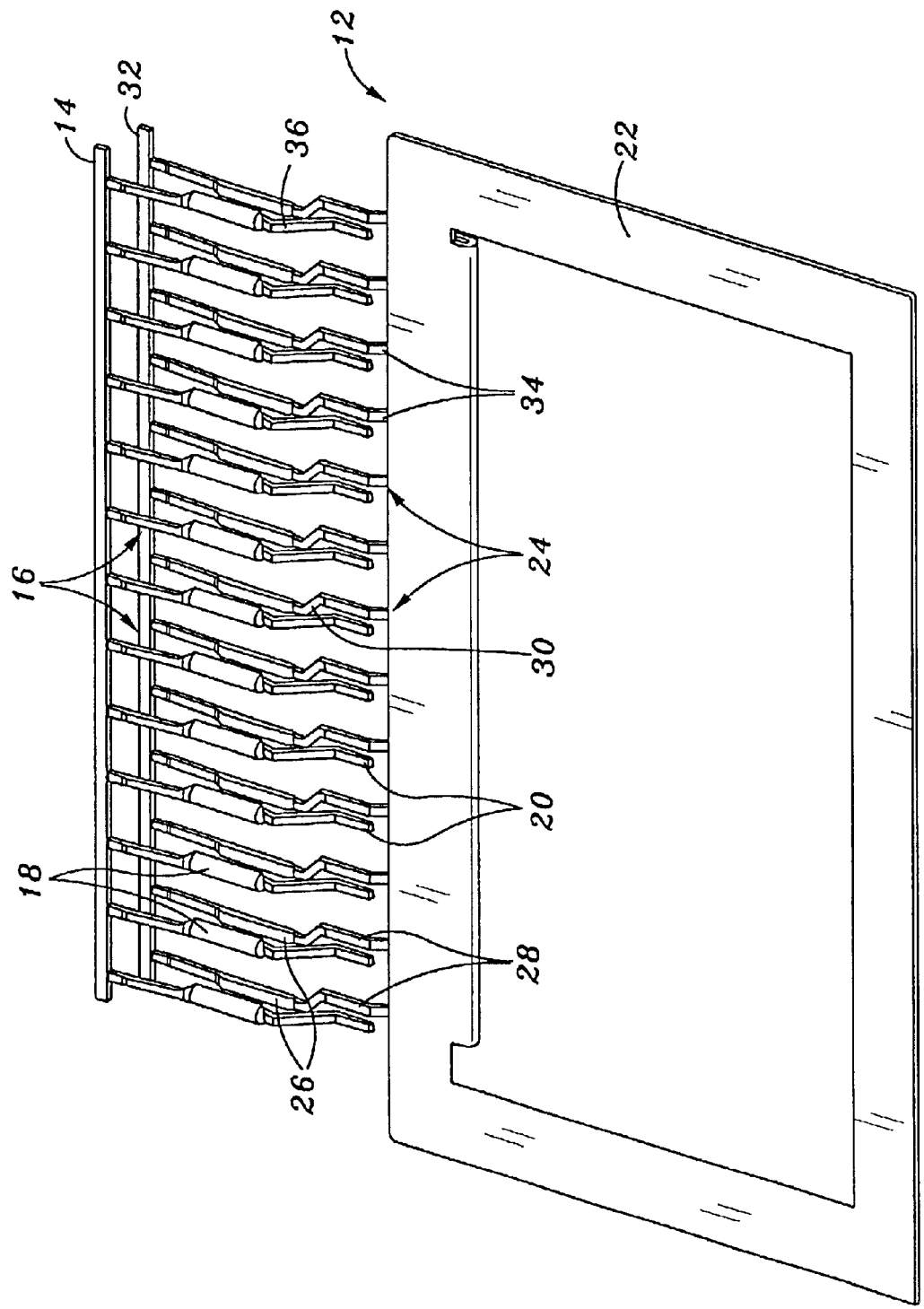

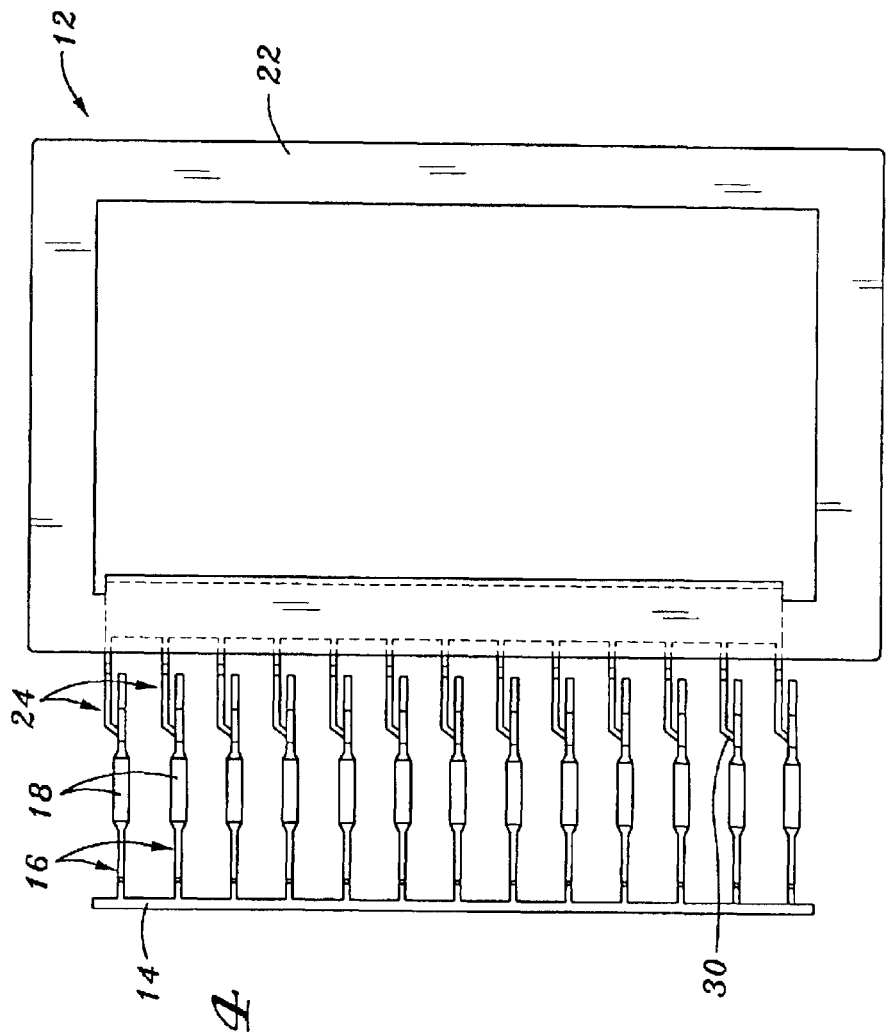
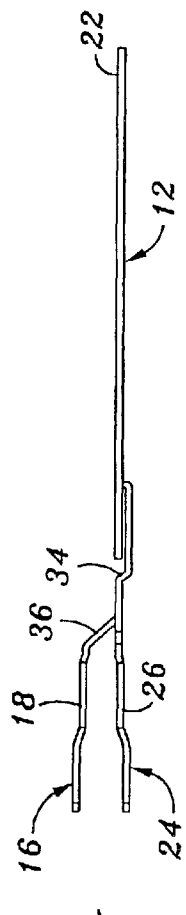

COMPACT FLASH MEMORY CARD WITH CLAMSHELL LEADFRAME

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to memory cards and, more particularly, to a memory card including a copper leadframe which is bent into a "clamshell" configuration and specifically configured for use as the connector of a conventional compact flash (CF) card.

As is well known in the electronic arts, computers have used rotating magnetic media for mass storage of data, programs and information. Though widely used and commonly accepted, such hard disk drives suffer from a variety of deficiencies. Because of the rotation of the disk, there is an inherent latency in extracting information from a hard drive disk. Other problems are especially dramatic in portable computers. In particular, hard disks are unable to withstand many of the kinds of physical shock that a portable computer will likely sustain. Further, the motor for rotating the disk consumes significant amounts of power, thus decreasing the battery life for portable computers.

In the field of electronics, solid state memory (flash memory) has been determined to be an ideal choice for replacing a hard disk drive for mass storage since it resolves many of the above-described problems. Flash memory is typically implemented in the form of compact flash (CF) cards which comprise small, removable mass storage devices. CF cards and other compact flash storage products are designed with flash technology, which is a non-volatile storage solution not requiring a battery to retain data indefinitely. CF cards and other CF storage products are solid state, meaning that they contain no moving parts, and provide users with much greater protection of their data than conventional magnetic disk drives. CF storage products are generally considered to be five to ten times more rugged and reliable than disk drives including those found in personal computers, and typically consume only five percent of the power required by small disk drives. Because they are solid state, CF cards are used predominately in digital cameras, personal digital assistants (PDA's), and other portable electronic devices. A species of a CF card is a multimedia card (M.M.C.) which is typically used in digital music players and digital camcorders.

CF cards as currently known typically comprise a hollow housing having a substrate disposed within the interior thereof. Mounted or electrically connected to the substrate are various electronic components, including SMT devices and passive components. The substrate includes conductive traces or patterns which place these devices/components into electrical communication with each other in a prescribed manner. One of the electronic devices/components typically mounted to the substrate is a controller which governs or regulates the routing of signals between the remaining devices/components. The substrate having the various devices/components electrically connected thereto is enclosed within the housing by a lid which is attached to the housing. Also electrically connected to the substrate is a connector, a portion of which extends to the exterior of the housing. The connector used with CF cards is similar to a PCMCIA card connector, but typically includes fifty pins.

Though providing significant benefits and economies in many applications, one of the largest drawbacks associated with CF cards is the relatively high costs involved in the manufacture thereof. In this regard, the various components of current CF cards including the housing (and lid), the substrate, and the connector are costly, and thus significantly increase the overall cost of the CF card. The present invention provides a low cost version of a CF card which fits into standard processing, but employs leadframe technology in a fashion which allows for the elimination of at least the connector component of a conventional CF card. As a result, the cost of manufacturing the compact flash product (i.e., memory card) of the present invention is substantially less than the manufacturing costs related to existing CF cards. These objectives of the present invention are achieved through the use of a copper leadframe which is bent into a "clamshell" configuration. The bent leadframe is itself used as the CF connector. These, and other features and advantages of the present invention, will be discussed in more detail below.

SUMMARY OF THE INVENTION

The present invention provides various embodiments of a memory card and semiconductor package wherein a leadframe is bent into a clamshell configuration. In certain embodiments of the present invention, the bent leadframe includes first and second sets of leads which are arranged in vertically aligned pairs exposed within the package body or housing. These exposed, vertically aligned pairs of leads are configured to mimic the structure and functionality of the fifty pin connector of a conventional CF card. In another embodiment of the present invention, the leads of the bent or folded over leadframe include portions which are exposed within a common side or face of the package body, defining a footprint for the semiconductor package. The use of a bent leadframe in accordance with the various embodiments of the present invention provides manufacturing economies and/or increased density capability not found in similar prior art devices.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 3 is a top perspective view of the leadframe shown in FIG. 2 in a bent, partially singulated state;

FIG. 4 is a top plan view of the leadframe shown in FIG. 3;

FIG. 5 is a side-elevational view of the leadframe shown in FIG. 4;

Common reference numerals are used throughout the drawings and detailed description to indicate like elements.

DETAILED DESCRIPTION OF THE INVENTION

Figure 1:
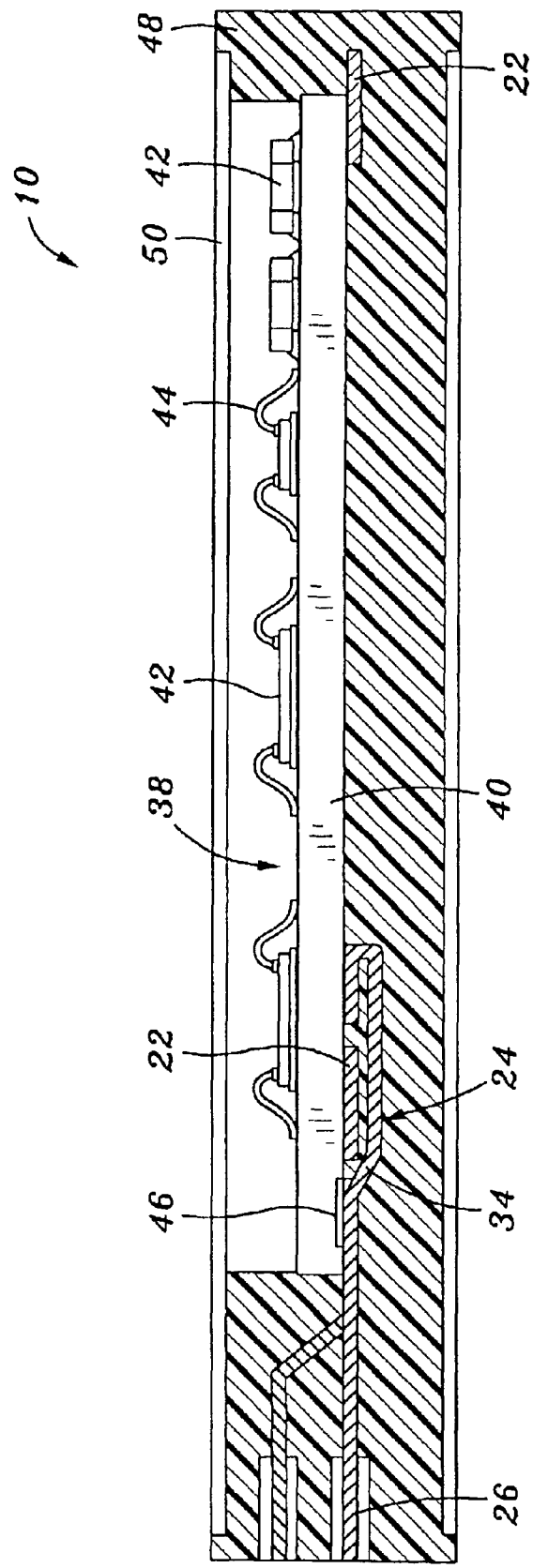
FIG. 1 is a partial cross-sectional view of a memory card constructed in accordance with a first embodiment of the present invention.

Referring now to the drawings wherein the showings are for purposes of illustrating preferred embodiments of the present invention only, and not for purposes of limiting the same, FIG. 1 depicts in cross-section a compact flash (CF) memory card 10 constructed in accordance with a first embodiment of the present invention. The memory card 10 of the first embodiment is a "single-sided" version, differing from a "double-sided" version which will be described in more detail below. As seen in FIGS. 2–5, the memory card 10 comprises a leadframe 12 which, in an initial unbent state, has a quadrangle shape. The leadframe 12 comprises a continuous outer frame portion or shorting bar 14. Integrally connected to and extending inwardly from one common side of the shorting bar 14 is a first set of elongate leads 16. The leads 16 of the first set are arranged in equidistantly spaced relation to each other, and each define an elongate, arcuately contoured coined portion 18 and a land portion 20. The land portions 20 of the leads 16 extend to the distal ends thereof.

In addition to the leads 16 of the first set, attached to three sides of the shorting bar 14 and suspended within the interior thereof is a main frame 22 which has a generally rectangular configuration. Integrally connected to a common side of the main frame 22 are a plurality of leads 24 of a second set which extend inwardly into the interior of the main frame 22. Similar to the leads 16 of the first set, each lead 24 of the second set includes an elongate, arcuately contoured coined portion 26 and a land portion 28. In addition to the coined and land portions 26, 28, each lead 24 of the second set includes a bent or angled portion 30 which extends between the coined and the land portions 26, 28 thereof.

Figure 2:
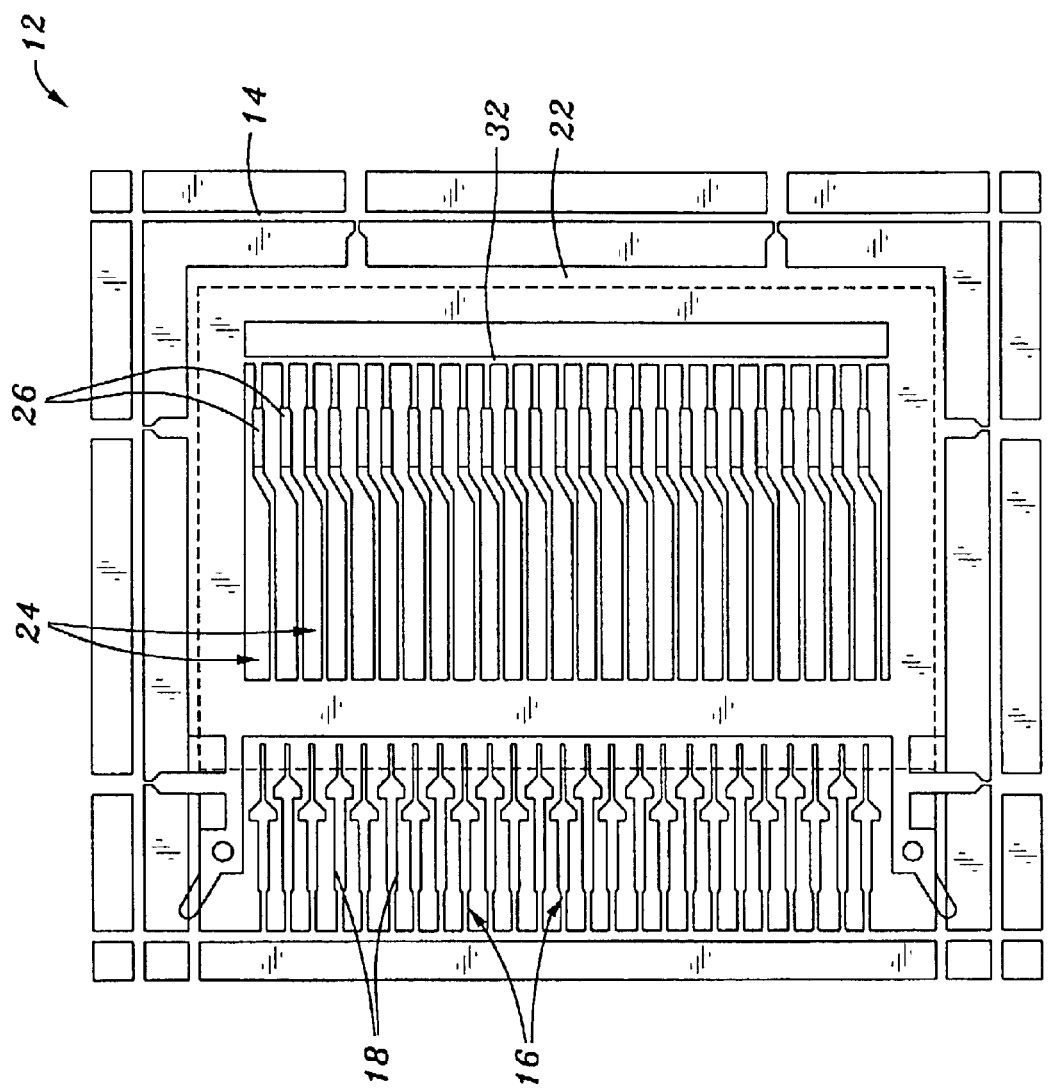
FIG. 2 is a top plan view of the leadframe of the memory card of the first embodiment in a preliminary, unbent state.

The distal ends of the leads 24 of the second set are each integrally connected to a cross-bar 32 which is itself integrally connected to and extends perpendicularly between opposed sides of the main frame 22. The leads 24 of the second set are themselves arranged in equidistantly spaced relation to each other. As shown in FIG. 2, twenty-five leads 16 are included in the first set, with an additional twenty-five leads 24 being included in the second set. In FIGS. 3 and 4, only thirteen leads 16, 24 are shown as being included in each of the first and second sets thereof. The reduced number of leads 16, 24 shown in FIGS. 3 and 4 is for purposes of clarity only, with the leadframe 12 preferably being formed to include twenty-five leads 16, 24 within each of the first and second sets as shown in FIG. 2. The leadframe 12 is preferably fabricated from a conductive metallic material such as copper via either a chemical etching or mechanical stamping technique.

Subsequent to the formation of the leadframe 12 as shown in FIG. 2, the same is subjected to singulation and bending operations to cause the same to assume the configuration shown in FIGS. 3 and 4. More particularly, the cross-bar 32 is severed from the main frame 22, with the leads 24 of the second set thereafter being bent so as to extend in juxtaposed relation to respective ones of the leads 16 of the first set. In addition to being bent or folded over one side of the main frame 22, each of the leads 24 of the second set is bent to facilitate the formation of an upwardly angled portion 34 therein. The upwardly angled portion 34 of each lead 24 is sized and configured so as to result in the top surface of the land portion 28 thereof extending in generally co-planar relation to the top surface of the main frame 22.

The leads 16 of the first set are themselves bent so as to each include a downwardly angled portion 36. The downwardly angled portion 36 of each lead 16 is sized and configured so as to cause the top surface of the land portion 20 thereof to extend in generally co-planar relation to the top surface of the main frame 22. In the unbent leadframe 12 shown in FIG. 2, the leads 16, 24 of the first and second sets are oriented relative to each other such that the bending or folding over of the leads 24 in the above-described manner coupled with the formation of the upwardly angled portions 34 within the leads 24 and the downwardly angled portions 36 within the leads 16 causes the land portion 28 of each lead 24 to extend in side-by-side, generally parallel relation to the land portion 20 of a respective one of the leads 16 in the manner shown in FIGS. 3–5. Thus, the land portions 20, 28 of the leads 16, 24 are segregated into adjacent pairs, with the top surfaces of the land portions 20, 28 of each pair being generally co-planar with the top surface of the main frame 22.

Though the top surfaces of the land portions 20, 28 are generally co-planar to each other and to the top surface of the main frame 22 (i.e., the land portions 20, 28 are horizontally aligned), the coined portions 18, 26 of the leads 16, 24 are segregated into vertically spaced pairs in the manner also best shown in FIGS. 3 and 5. In this regard, the formation of the downwardly angled portions 36 within the leads 16 causes the coined portions 18 of the leads 16 to be disposed above the coined portions 26 of the leads 24. However, the coined portions 26 of the leads 24 are brought into vertical registry with respective ones of the coined portions 18 due to the inclusion of the angled portions 30 within the leads 24. As shown in FIG. 3, the relative orientations of the leads 16, 24 subsequent to the bending or folding over of the leads 24 results in the cross-bar 32 (which is previously disconnected from the main frame 22) extending in vertically spaced, generally parallel relation to that segment of the shorting bar 14 to which the leads 16 are connected.

In addition to the leadframe 12, the memory card 10 comprises a laminate subassembly 38 which is electrically connected to the leadframe 12 subsequent to the bending thereof in a manner which will be described in more detail below. The laminate subassembly 38 comprises a substrate 40 defining opposed, generally planar top and bottom surfaces. Electrically connected to a common side or surface of the substrate 40 (i.e., the top surface) are one or more electronic components 42. The components) 42 may comprise SMT devices and/or passive components. It is contemplated that the substrate 40 will include conductive traces to which the components 42 are electrically connected when mounted to the substrate 40. As shown in FIG. 1, certain ones of the components 42 are electrically connected to the conductive traces via conductive wires 44. The conductive traces are configured to facilitate the routing of signals between the components 42 in a prescribed manner. In the laminate subassembly 38, the conductive traces effectively route the signals to terminal pads 46 which are disposed upon that side or surface of the substrate 40 opposite that including the components 42 mounted thereto (i.e., the bottom surface). The terminal pads 46 extend along one peripheral edge segment of the substrate 40, and are arranged in a pattern which allows each of the terminal pads 46 to be brought into direct, electrical contact with a respective one of the land portions 20, 28 in a manner which will be described in more detail below.

In the memory card 10, the laminate subassembly 38 having the above-described structural attributes is electrically connected to the leadframe 12 by positioning the substrate 40 upon the main frame 22 such that the terminal pads 46 are aligned and brought into direct contact with respective ones of the land portions 20, 28 of the leads 16, 24. As is apparent from FIG. 1, the substrate 40 of the laminate subassembly 38 is preferably sized such that it extends along at least portions of the top surfaces of all four peripheral segments of the main frame 22. As such, the opening defined within the main frame 22 as a result of the bending or folding over of the leads 24 is completely covered by the substrate 40. The profile of the substrate 40 is shown by the dashed lines depicted in FIG. 2. The bottom surface of the substrate 40 is positioned upon the main frame 22. The substrate 40 is preferably affixed to the main frame 22 through the use of an epoxy. Prior to such affixation, the top surfaces of the land portions 20, 28 and/or the terminal pads 46 are preferably subjected to a solder paste screening process or solder bumped so that the completion of a reflow process subsequent to the epoxy attachment of the substrate 40 to the main frame 22 will facilitate the electrical connection of each terminal pad 46 of the laminate subassembly 38 to a respective one of the land portions 20, 28.

Upon the completion of such solder reflow process, the leadframe 12 is singulated to remove the shorting bar 14 from the main frame 22 and from the leads 16, with those portions of the leads 16 extending from the coined portions 18 thereof to the shorting bar 14 also being removed as a result of the singulation process. The singulation process also results in the removal of the cross-bar 32 as well as those portions of the leads 24 extending from the coined portions 26 thereof to the cross-bar 32. Despite such singulation, the remaining portions of the leads 16, 24 are maintained in fixed relation to each other due to the land portions 20, 28 thereof being electrically connected to and therefore fixed to the laminate subassembly 38. Additionally, those portions of the leads 24 extending between the upwardly angled portions 34 thereof and the main frame 22 are subjected to a cutting operation (e.g., a laser cut) as is needed to facilitate the electrical isolation of the leads 24 from each other. Though such cut effectively separates the leads 24 from the main frame 22, the leads 24 are maintained in fixed relation to the leads 16 by virtue of their electrical connection to the laminate subassembly 38 as indicated above.

Subsequent to the completion of the singulation/cutting of the leadframe 12 in the above-described manner, the leadframe 12 and the laminate subassembly 38 electrically connected thereto are at least partially encapsulated with an encapsulant material to facilitate the formation of a package body 48 of the memory card 10. As seen in FIG. 1, the package body 48 is preferably formed or molded in a manner wherein the coined portions 18, 26 of the leads 16, 24 extend or protrude into respective slots or cavities defined within the package body 48. The remaining portions of the leads 16, 24 are completely encapsulated by the package body 48, as is the main frame 22 of the leadframe 12. The package body 48 is preferably formed to define another recess or cavity which accommodates the laminate subassembly 38 in a manner wherein the bottom surface of the substrate 40 is covered by the package body 48, with the top surface of the substrate 40 having the components 42 mounted thereto being uncovered and thus exposed within the cavity. In this configuration, the components 42 may be protected via the subsequent attachment of a separate lid 50 to the package body 48, with the lid 50 being sized and configured to cover the cavity formed within the package body 48 to accommodate the laminate subassembly 38. Alternatively, the package body 48 could be formed to completely cover or encapsulate the laminate subassembly 38, thus eliminating the need for the lid 50. As will be recognized, in the completed memory card 10, the coined portions 18, 26 exposed within the package body 48 mimic the structure and functionality of the fifty pin connector of a conventional CF card.

Figure 6:
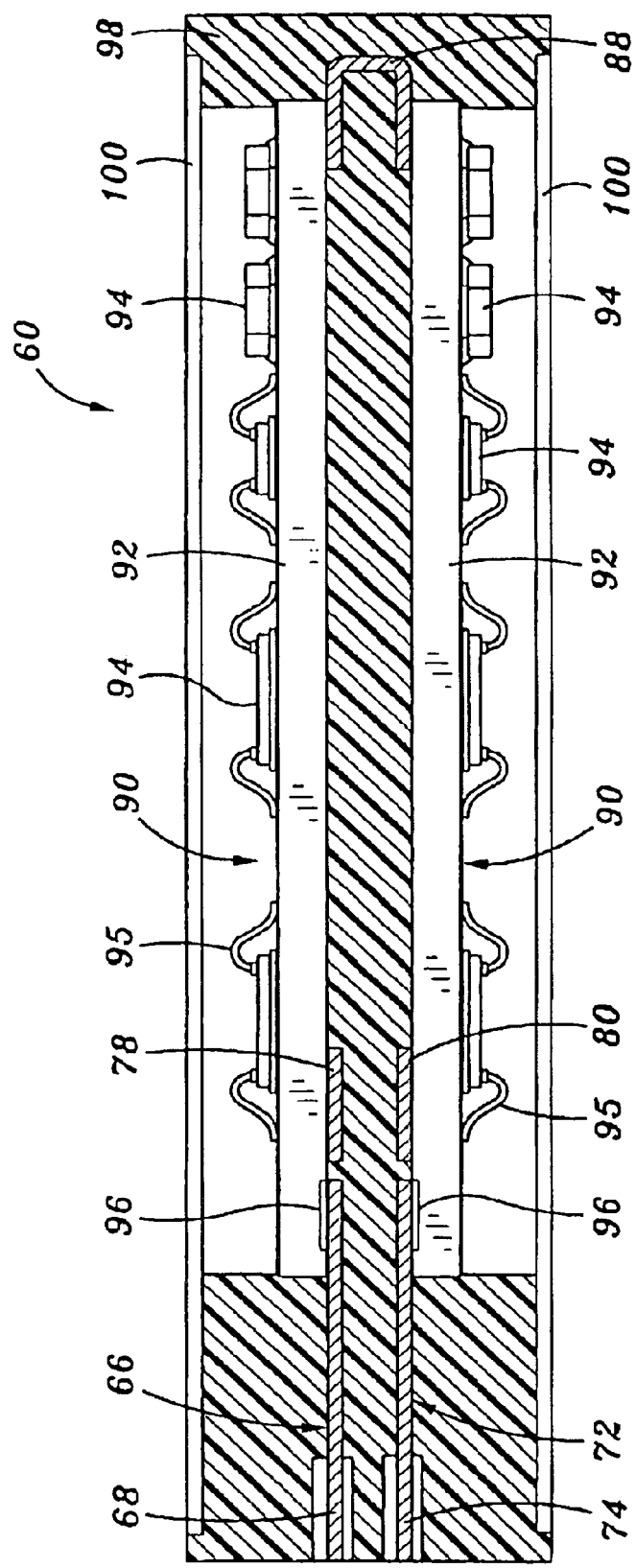
FIG. 6 is a partial cross-sectional view of a memory card constructed in accordance with a second embodiment of the present invention.
Figure 7:
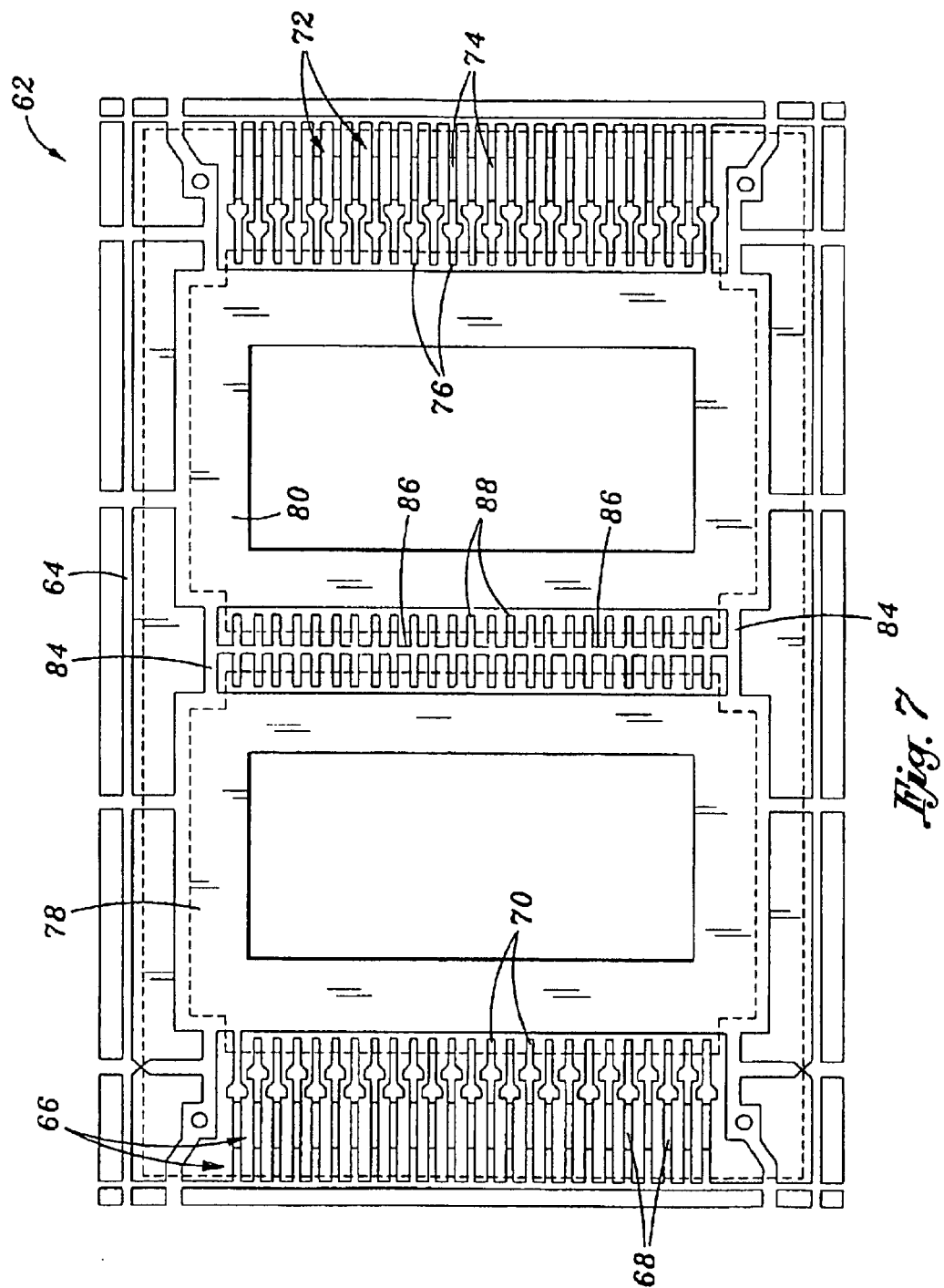
FIG. 7 is a top plan view of the leadframe of the memory card of the second embodiment in a preliminary, unbent state.

Referring now to FIG. 6, there is shown in cross-section a compact flash (CF) memory card 60 constructed in accordance with a second embodiment of the present invention. The memory card 60 of the second embodiment comprises the "double-sided" version described above. As seen in FIG. 7, the memory card 60 comprises a leadframe 62 which, in an initial unbent state, has a quadrangle shape (i.e., a generally rectangular configuration). The leadframe 62 comprises an outer frame portion or shorting bar 64 which defines two longitudinally extending sides or segments and two laterally extending sides or segments. Integrally connected to and extending inwardly from one lateral side of the shorting bar 64 is a first set of elongate leads 66. The leads 66 of the first set are arranged in equidistantly spaced relation to each other, and each define an elongate, arcuately contoured coined portion 68 and a land portion 70. The land portions 70 of the leads 68 extend to the distal ends thereof.

In addition to the leads 66 of the first set, integrally connected to and extending inwardly from the remaining lateral side of the shorting bar 64 is a second set of elongate leads 72. The leads 72 of the second set are identically configured to the leads 66 of the first set and are arranged in equidistantly spaced relation to each other. Each lead 72 defines an elongate, arcuately contoured coined portion 74 and a land portion 76. The land portions 76 of the leads 72 of the second set extend to the distal ends thereof.

In addition to the leads 66, 72 of the first and second sets, attached to the longitudinal sides of the shorting bar 64 and suspended within the interior thereof is a first main frame 78 and a second main frame 80. The first and second main frames 78, 80 each have a generally rectangular configuration. The distal ends of the leads 66 of the first set extend toward, but are spaced from, one longitudinal side of the first main frame 78. Similarly, the distal ends of the leads 72 of the second set extend toward, but are spaced from, one longitudinal side of the second main frame 80. The leadframe 62 of the memory card 60 further comprises a pair of connecting bars 84 which are integrally connected to and extend perpendicularly between those longitudinal sides of the first and second main frames 78, 80 which are disposed adjacent to each other. Extending perpendicularly between the connecting bars 84 is an elongate cross-bar or shorting bar 86 which extends in spaced, generally parallel relation to the longitudinal sides of the first and second main frame 78, 80. Integrally connected to the shorting bar 86 are a plurality of leads 88 of a third set which extend perpendicularly relative to the shorting bar 86 toward each of the adjacent longitudinal sides of the first and second main frames 78, 80. However, the leads 88 of the third set do not contact the first and second main frames 78, 80, but rather are spaced therefrom at a distance substantially equal to that separating the distal ends of the leads 66, 72 from respective ones of the longitudinal sides of the first and second main frames 78, 80. In the memory card 60 of the second embodiment, twenty-five leads 66 are included in the first set, with twenty-five leads 72 being included in the second set and twenty-five leads 88 being included in the third set. Those of ordinary skill in the art will recognize that the inclusion of twenty-five leads 66, 72, 88 in each of the first, second and third sets thereof is exemplary only, and that differing numbers of leads may be included in such sets without departing from the spirit and scope of the present invention. The leadframe 62 is preferably fabricated from a conductive metallic material such as copper via either a chemical etching or mechanical stamping technique.

In addition to the leadframe 62, the memory card 60 comprises a pair of laminate subassemblies 90 which are each electrically connected to the leadframe 62 in a manner which will be described in more detail below. Each laminate subassembly 90 comprises a substrate 92 defining opposed, generally planar top and bottom surfaces. Electrically connected to the top surface of each substrate 92 are one or more electronic components 94. The component(s) 94 may comprise SMT devices and/or passive components. It is contemplated that each substrate 92 will include conductive traces to which the components 94 are electrically connected when mounted to the corresponding substrate 92. Certain ones of the components 94 may be electrically connected to the conductive traces via conductive wires 95. The conductive traces of each substrate 92 are configured to facilitate the routing of signals between the components 94 mounted thereto in a prescribed manner. In each laminate subassembly 90, the conductive traces effectively route the signals to terminal pads 96 which are disposed on the bottom surface of the substrate 92. The terminal pads 96 of each laminate subassembly 90 extend along one peripheral edge segment of the substrate 92 thereof, and are arranged in a pattern which allows each of the terminal pads to be brought into direct, electrical contact with respective ones of the land portion 70 of the leads 66 or respective ones of the land portions 76 of the leads 72 in a manner which will be described in more detail below.

In the memory card 60 of the second embodiment, the laminate subassemblies 90 are electrically connected to the leadframe 62 by positioning each substrate 92 upon a respective one of the first and second main frames 78, 80 such that the terminal pads 96 of one laminate subassembly 90 are aligned and brought into direct contact with respective ones of the land portions 70 of the leads 66, and the terminal pads 96 of the remaining one of the laminate subassemblies 90 are brought into direct contact with respective ones of the land portions 76 of the leads 72. The substrate 92 of each laminate subassembly 90 is preferably sized such that it extends along at least portions of the top surfaces of all four peripheral segments of either the first main frame 78 or the second main frame 80. As such, the generally rectangularly openings defined by each of the first and second main frames 78, 80 are completely covered by respective ones of the substrates 92. The profile of the substrate 92 of each laminate subassembly 90 is depicted by broken lines in FIG. 7. The bottom surfaces of the substrates 92 are positioned upon respective ones of the first and second main frames 78, 80, with the affixation of the substrates 92 to the first and second main frames 78, 80 preferably being accomplished through the use of an epoxy. Prior to such affixation, the top surfaces of the land portions 70, 76 and/or the terminal pads 96 of each of the laminate subassemblies 90 are preferably subjected to a solder paste screening process or solder bumped so that the completion of a reflow process subsequent to the epoxy attachment of the substrates 92 to the first and second main frames 78, 80 will facilitate the electrical connection of the terminal pads 96 of one laminate subassembly 90 to respective ones of the land portions 70, and the electrical connection of the terminal pads 96 of the remaining laminate subassembly 90 to respective ones of the land portions 76.

Upon the completion of such solder reflow process, the leadframe 62 is singulated to remove the shorting bar 64 from the first and second main frames 78, 80 and from the leads 66, 72. Also removed as a result of the singulation process are those portions of the leads 66 extending between the coined portions 68 and shorting bar 64, and those portions of the leads 72 extending between the coined portions 74 and the shorting bar 64. Despite such singulation, the remaining portions of the leads 66 are maintained in fixed relation to each other due to the land portions 70 thereof being electrically connected to and therefore fixed to one of the laminate subassemblies 90. Similarly, the remaining portions of the leads 72 are maintained in fixed relation to each other due to the land portions 76 thereof being electrically connected to and therefore fixed to one of the laminate subassemblies 90.

Subsequent to the completion of the singulation/cutting of the leadframe 62 in the above-described manner, the leadframe 62 is bent about an axis defined by the shorting bar 86 so as to assume the folded configuration shown in FIG. 6. When the leadframe 62 is bent in this manner, the original orientations of the leads 66, 72 as shown in FIG. 7 causes the coined portions 68, 74 thereof to be segregated into twenty-five pairs, with the coined portions 68, 74 of each pair being in vertically aligned registry with each other. Additionally, the bending or folding of the leadframe 62 is completed in a manner wherein the laminate subassemblies 90 are directed outwardly, i.e., are not disposed interiorly between the first and second main frames 78, 80 of the folded leadframe 62. It is contemplated that either prior or subsequent to the bending or folding of the leadframe 62 in the above-described manner, those portions of the shorting bar 86 interconnecting the leads 88 of the third set to each other may be removed for purposes of isolating the leads 88 of the third set from each other.

Subsequent to the bending or folding of the leadframe 62 in the above-described manner, the leadframe 62 and the laminate subassemblies 90 electrically connected thereto are at least partially encapsulated with an encapsulant material to facilitate the formation of a package body 98 of the memory card 60. The package body 98 is preferably formed or molded in a manner wherein the coined portions 68, 74 of the leads 66, 72 extend or protrude into respective slots or cavities defined within the package body 98. The remaining portions of the leads 66, 72 are completely encapsulated by the package body 98, as are the leads 88 of the third set and first and second main frames, 78, 80. The package body 98 is further preferably formed to define an additional pair of recesses or cavities which accommodate respective ones of the laminate subassemblies 90 such that the bottom surfaces of the substrates 92 are covered by the package body 98, with the top surfaces of the substrates 92 having the components 94 mounted thereto being uncovered and thus exposed within a respective one of the cavities. In this configuration, the components 94 may be protected via the subsequent attachment of separate lids 100 to the package body 98, with the lids 100 being sized and configured to cover respective ones of the cavities formed within the package body 98. Alternatively, the package body 98 could be formed to completely cover or encapsulate the laminate subassemblies 90, thus eliminating the need for the lids 100. In the completed memory card 60, the coined portions 68, 74 exposed within the package body 98 mimic the structure and functionality of the fifty pin connector of a conventional CF card.

In the memory card 60 of the second embodiment, it is contemplated that the leads 88 of the third set can optionally be used to facilitate the electrical interconnection between the laminate subassemblies 90. In this regard, conductive wires may be used to electrically connect a component 94 of each laminate subassembly 90 to a common lead 88 extending between the first and second main frames 78, 80. If necessary, the lead frame 62 could be subjected to further cuts as is needed to electrically isolate certain leads 88 of the third set from each other. As will be recognized, any conductive wires used to facilitate the electrical connection of the laminate subassemblies 90 to one or more of the leads 88 would also be encapsulated by the package body 98. Additionally, it is contemplated that as an alternative to the use of conductive wires to facilitate the electrical connection of the laminate subassemblies 90 to one or more of the leads 88, solder connections may be employed by outfitting each of the laminate subassemblies 90 with additional terminal pads like the terminal pads 96 described above. Such additional terminal pads of the laminate subassemblies 90 would be used to facilitate the electrical connection thereof to one or more of the leads 88 via soldered connections.

Advantageously, the memory cards 10, 60 of the first and second embodiments do not include the connector of prior art CF cards in that the coined ends of the leads effectively function as such CF connector. Additionally, the lid component of the prior CF cards may be eliminated in the memory card 10 and the memory card 60, thus also eliminating the separate manufacturing step of attaching the lid to the housing. Thus, the memory card 10, 60 is significantly more simple in construction than prior art CF cards, and thus significantly less costly to manufacture.

It is contemplated that various modifications may be implemented within the memory card 60 of the second embodiment without departing from the spirit and scope of the present invention. For example, the laminate subassemblies 90 need not necessarily be attached to common sides of the first and second main frames 78, 80. If attached to opposite sides of the first and second main frames 78, 80, the bending of the leadframe 62 will result in one of the laminate subassemblies 90 being externally presented, with the remaining one of the laminate subassemblies 90 being disposed between the first and second main frames 78, 80.

Figure 8:
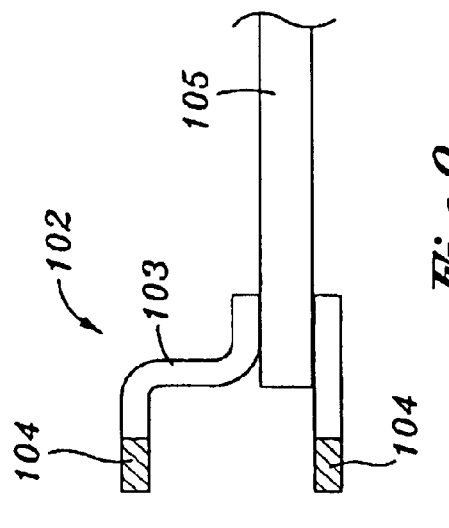
FIG. 8 is a side-elevational view of a fold-over leadframe constructed in accordance with a third embodiment of the present invention used to mimic the functionality of a CF connector.
Figure 9:
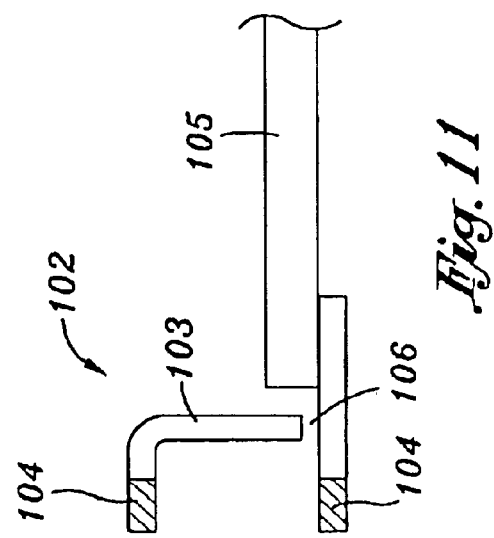
FIG. 9 is a side-elevational view of the fold-over leadframe shown in FIG. 8 subsequent to the singulation thereof.

Referring now to FIGS. 8 and 9, in accordance with a third embodiment of the present invention there is shown a leadframe 102 which is bent into a clamshell configuration in a manner allowing the same to ultimately serve as a CF connector for a memory card. The leadframe 102 comprises a plurality of elongate leads 103 which extend in spaced relation to each other and each define a proximal end and an opposed distal end. Formed within each lead 103 between the proximal and distal ends thereof is a spaced pair of coined portions 104. The leadframe 102 may be bent such that the proximal and distal ends of each lead 103 are disposed in juxtaposed relation to each other, with the coined portions 104 being disposed in opposed, spaced relation to each other. An edge of a substrate 105 may be advanced between the juxtaposed proximal and distal ends of the leads 103, with such proximal and distal ends being electrically connected to corresponding conductive traces on the opposed surfaces of the substrate 105. Such electrical connection facilitates the placement of the leads 103 into electrical communication with the substrate 105 in a desired manner. Though not shown, mounted (i.e., electrically connected) to the substrate 105 are electronic components which are placed into electrical communication with the leads 103 via the conductive traces of the substrate 105.

Figure 10:
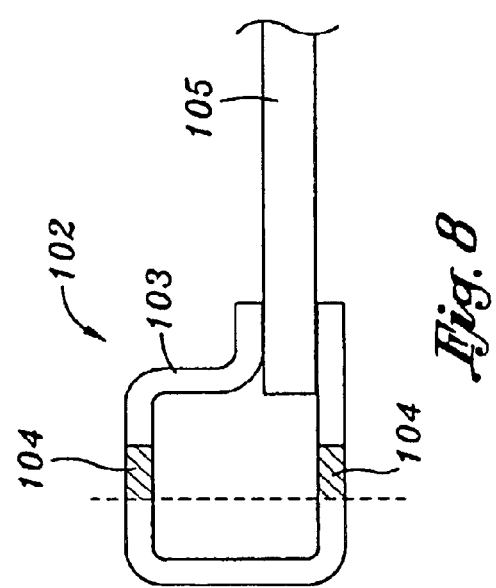
FIG. 10 is a side-elevational view of a fold-over leadframe constructed in accordance with a fourth embodiment of the present invention used to mimic the functionality of a CF connector.
Figure 11:
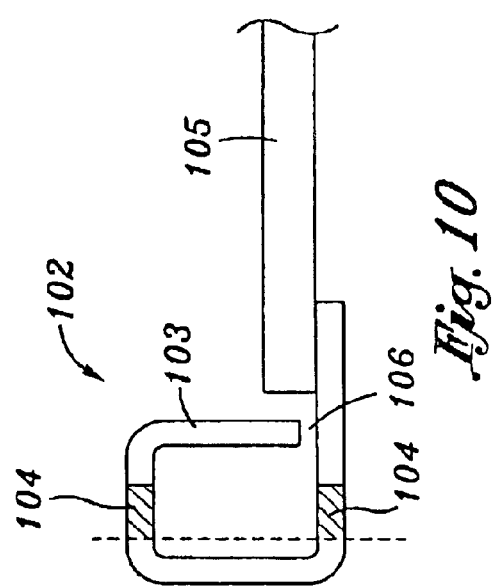
FIG. 11 is a side-elevational view of the fold-over leadframe shown in FIG. 10 subsequent to the singulation thereof.

As shown in FIGS. 10 and 11, in accordance with a fourth embodiment of the present invention the leadframe 102 may alternatively be bent such that the distal end of each lead 103 is separated from a central portion thereof via a narrow gap 106. However, in this variation, the coined portions 104 of the leads 103 are still disposed in opposed, spaced relation to each other. Thus, only that portion of each lead 103 extending to the proximal end thereof is electrically connected to one side of the substrate 105. In either variation, the leadframe 102 and substrate 105 (including the electronic components mounted thereto) are encapsulated by a molded housing or package body, with such molded housing subsequently being cut or singulated (FIGS. 9 and 11) in a manner removing a portion of the leadframe 102 as results in the coined portions 104 of the leads 103 defining coined ends which serve as a CF connector.

Figure 12:
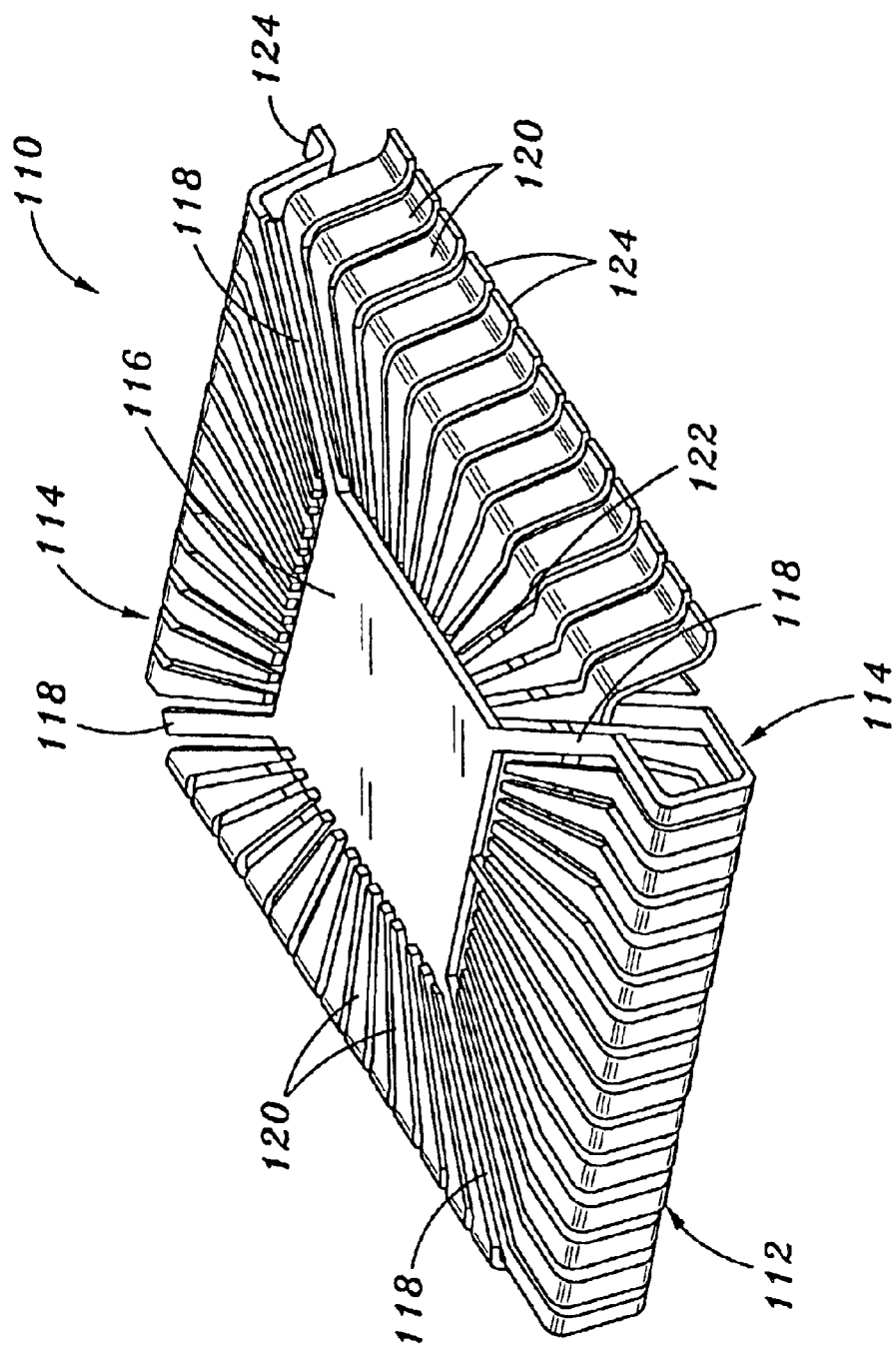
FIG. 12 is a top perspective view of a fold-over leadframe used in a semiconductor package constructed in accordance with a fifth embodiment of the present invention.
Figure 13:
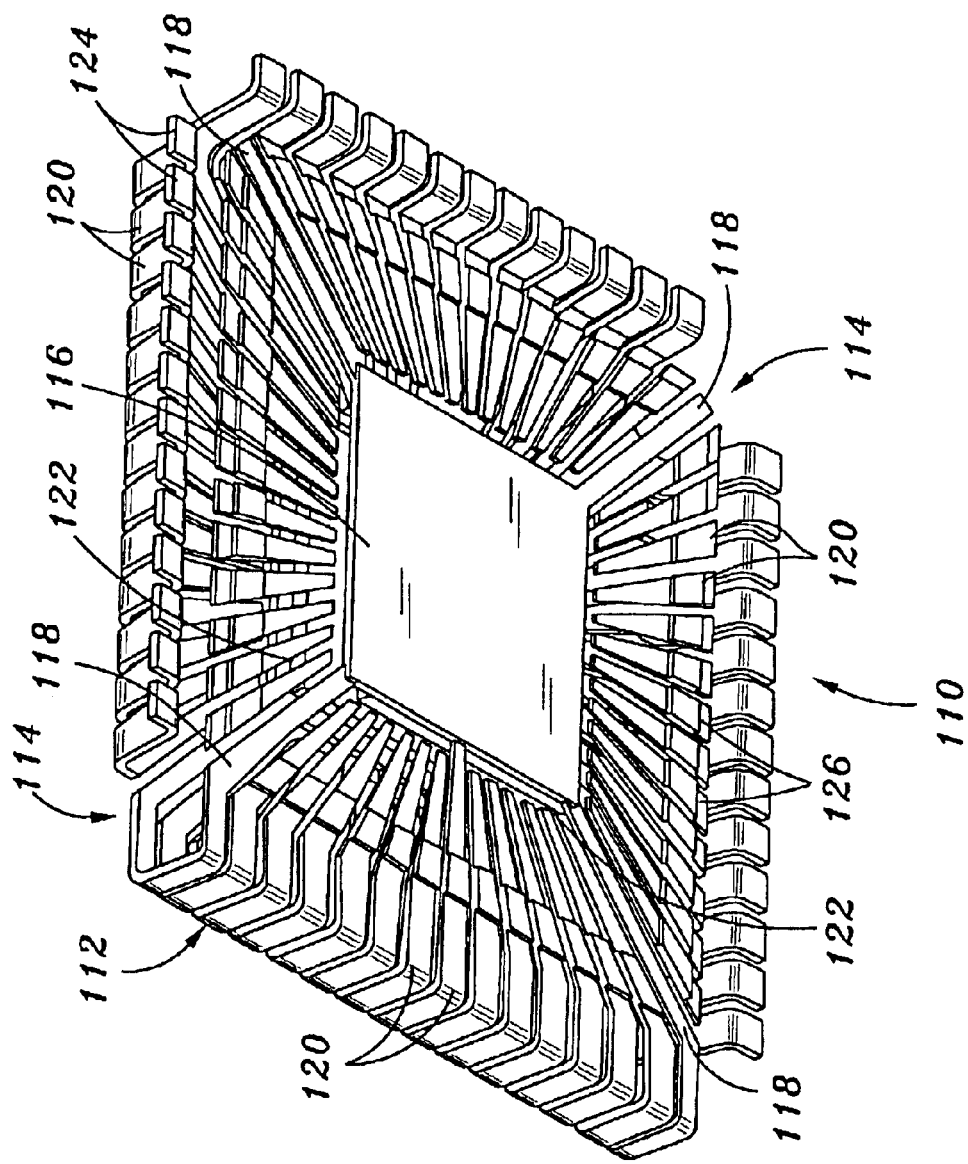
FIG. 13 is a bottom perspective view of the fold-over leadframe shown in FIG. 12.

Referring now to FIGS. 12 and 13, there is shown a clamshell semiconductor package 110 constructed in accordance with a fifth embodiment of the present invention. To fabricate the semiconductor package 110, an elongate leadframe 112 is provided which, in an initial unbent state, has a generally rectangular configuration. The strip 112 includes a continuous outer frame portion which defines the opposed longitudinal sides and the opposed lateral sides thereof. Disposed within the outer frame portion is a pair of identically configured leadframes 114 of the leadframe strip 112 which are connected to each other in a manner which will be described in more detail below.

Each leadframe 114 of the leadframe strip 112 includes a die pad 116 comprising a substantially square plate which is connected to the outer frame portion by a plurality of tie bars 118 of the leadframe 114. Four tie bars 118 are typically used to connect the die pad 116 to the outer frame portion of the strip 112, with the tie bars 118 extending from respective ones of the four corner regions defined by the die pad 116.

Each leadframe 114 of the leadframe strip 112 further comprises a multiplicity of leads 120. The leads 120 of each leadframe 114 are segregated into four sets, with each set extending toward but being spaced from a respective one of the four peripheral edge segments defined by the die pad 116. The leads 120 of each set are typically equidistantly spaced from each other, with narrow gaps of equal width being defined therebetween. One set of the leads 120 of each of the leadframes 114 extends to a respective one of the lateral sides defined by the outer frame portion of the strip 112. Additionally, two sets of the leads 120 of each leadframe 114 disposed in opposed relation to each other extend to respective ones of the longitudinal sides defined by the outer frame portion of the strip 112. The remaining two sets of leads 120 of the leadframes 114 (i.e., those sets disposed in opposed relation to the sets extending to the lateral sides of the outer frame portion) are integrally connected to each other. In this regard, the leads 120 of the integrally connected sets extend to each of the die pads 116 of the strip 112. As seen in FIGS. 12 and 13, the center lead 120 of these integrally connected sets extends and is connected to the peripheral edge of each of the die pads 116.

The strip 112 is preferably fabricated from a copper material, and formed via the completion of an etching or mechanical stamping process. In the leadframe strip 112, the leads 120 of one of the leadframes 114 which extend to the lateral and longitudinal sides of the outer frame portion exceed the length of the same leads 120 of the remaining leadframe 114 for reasons which will be discussed in more detail below. Additionally, in the leadframe 114 having the shorter leads 120, all of the leads 120 of such leadframe 114 are preferably subjected to a half-etching process which is completed in a manner wherein the end portions of the leads 120 disposed furthest from the corresponding die pad 116 are thicker than the remaining portions thereof. The formation of the leads 120 of such leadframe 114 to each be of variable thickness is done for reasons which will also be discussed in more detail below.

In addition to the leadframe strip 112, the semiconductor package 110 of the fifth embodiment comprises a pair of semiconductor dies 122 which are electrically connected to respective ones of the leadframes 114 of the strip 112. Each semiconductor die 122 comprises opposed, generally planar top and bottom surfaces, with a plurality of terminal pads being disposed on the top surface thereof. The bottom surfaces of the semiconductor dies 122 are attached to respective ones of the die pads 116 through the use of an adhesive layer or strip. The semiconductor dies 122 are attached to common sides of the die pads 116, and thus are oriented in substantially co-planar relation to each other Upon the semiconductor dies 122 being attached to respective ones of the die pads 116 in the above-described manner, conductive wires are used to electrically connect the terminal pads of each semiconductor die 122 to respective ones of the leads 120 of the corresponding leadframe 114. Those conductive wires electrically connected to those leads 120 of the leadframes 114 which are integrally connected to each other may be used to facilitate the electrical communication between the semiconductor dies 122 in a prescribed manner. Upon the electrical connections being established between the semiconductor dies 122 and the leadframes 114 through the use of the conductive wires, each of the conductive wires may be covered or coated with a layer of an encapsulant material to provide mechanical protection to the same. As an alternative to the semiconductor dies 122, those of ordinary skill in the art will recognize that laminate subassemblies similar to those described above in relation to the prior embodiments may be electrically connected to respective ones of the die pads 116. In such laminate subassemblies, the terminal pads thereof would necessarily be oriented so as to allow for the electrical connection thereof to respective ones of the leads 120 through the use of conductive wires.

Subsequent to the electrical connection of the semiconductor dies 122 to the leadframes 114 in the above-described manner, the leadframe strip 112 is bent into a "clamshell" configuration as shown in FIGS. 12 and 13. The central portions or sections of the leads 120 which are integrally connected to each other are bent such that the leadframes 114, and in particular the die pads 116 thereof, extend in juxtaposed relation to each other. The leadframe strip 112 is preferably bent or folded such that the semiconductor dies 122 reside between the die pads 116. It will be recognized that the lengths of those leads 120 which are integrally connected to each other must be such that the bending thereof creates a gap between the die pads 116 of the leadframes 114 of sufficient width to accommodate both semiconductor dies 122.

Prior to the leadframe strip 112 being folded in the above-described manner, the same is preferably subjected to a singulation operation which facilitates the removal of the outer frame portion from the leadframes 114. The completion of the singulation process also completes the formation of the leads 120 having the differing lengths described above, i.e., those leads 120 of one leadframe 114 other than for the integrally connected leads 120 exceed the lengths of the leads 120 other than for the integrally connected leads 120 of the remaining leadframe 114. Those leads 120 of greater length are further subjected to a bending process to impart to the same a generally gull-wing configuration. As indicated above, those leads 120 of the leadframe strip 112 of shorter length are each half etched such that those end portions disposed furthest from the corresponding die pad 116 are thicker than the remainders thereof. As a result of these various configurations of the leads 120, the folding or bending of the leadframe strip 112 in the above-described manner results in the bottom surfaces of the outwardly flared portions 124 of the bent leads 120 of greater length extending in substantially co-planar relation to the bottom surfaces of the thickened end portions 126 of the leads 120 of shorter length. As best seen in FIG. 13, the flared portions 124 extend about three sides of the folded leadframe strip 112, though the thickened portions 126 extend about all four sides thereof.

After the leadframe strip 12 has been singulated and bent/folded in the above-described manner, the same is partially encapsulated or covered with an encapsulant material which, upon hardening, forms a molded housing or package body. The package body is formed in a manner wherein the bottom surfaces of the flared portions 124 and the bottom surfaces of the thickened portions 126 are exposed within the bottom surface of the package body and extend in substantially flush or continuous relation therewith. The remainder of the leadframe strip 112 and hence the semiconductor dies 122 (or laminate subassemblies) are completely encapsulated by the package body. The bottom surface of the die pad 116 toward which the leads 120 of shorter length extend may be exposed within the bottom surface of the package body, or may alternatively be completely covered thereby. The fold-over feature of the leadframe strip 112 of the semiconductor package 110 enables higher density since the leads 120 are located directly above each other. Despite this higher density, standard wire bonding processing is used in the fabrication of the semiconductor package 110 as described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure.

What is claimed is:

1. A memory card, comprising:
   a leadframe comprising:
   a main frame defining a peripheral side;

a first set of leads extending toward the peripheral side of the main frame; and a second set of leads extending away from the peripheral side of the main frame in juxtaposed relation to respective ones of the leads of the first set;

an electrical subassembly positioned upon the main frame and electrically connected to the leads of the first and second sets; and a package body at least partially encapsulating the leadframe and the electrical subassembly.

2. A memory card, comprising:

a leadframe comprising:
   a main frame defining a peripheral side;
   a first set of leads extending toward the peripheral side of the main frame; and
   a second set of leads extending away from the peripheral side of the main frame in juxtaposed relation to respective ones of the leads of the first set, wherein each of the leads of the first and second sets includes a land portion and a coined portion;

an electrical subassembly positioned upon the main frame and electrically connected to the land portions of the leads of the first and second sets; and a package body at least partially encapsulating the leadframe and the electrical subassembly, wherein the coined portion of each of the leads of the first and second sets is exposed within the package body.

3. The memory card of claim 2 wherein the electrical subassembly comprises:

a substrate defining opposed top and bottom surfaces and having a plurality of conductive traces which extend to the top surface and are adapted to route electrical signals to a plurality of terminal pads disposed on the bottom surface; and at least one electronic component disposed on the top surface and electrically connected to the conductive traces;

the terminal pads of the electrical subassembly being electrically connected to respective ones of the land portions of the leads of the first and second sets.

4. The memory card of claim 3 wherein the land portions of the leads of the first and second sets and the terminal pads of the electrical subassembly are arranged in complementary patterns such that the terminal pads are placed into direct, electrical contact with respective ones of the land portions.

5. A memory card, comprising:

a leadframe comprising:
   first and second main frames;
   a first set of leads extending toward the first main frame;
   a second set of leads extending toward the second main frame; and
   a third set of leads extending between the first and second main frames, the leads of the third set being shaped in a manner wherein the first and second main frames extend in opposed, spaced relation to each other and the leads of the first set extend in spaced, vertical registry with respective ones of the leads of the second set;

a first electrical subassembly positioned upon the first main frame and electrically connected to the leads of the first set;

a second electrical subassembly positioned upon the second main frame and electrically connected to the leads of the second set; and a package body at least partially encapsulating the leadframe and the first and second electrical subassemblies.

6. The memory card of claim 5 wherein the first and second electrical subassemblies are each electrically connected to respective ones of the leads of the third set.

7. The memory card of claim 5 wherein:

each of the leads of the first and second sets includes a land portion and a coined portion;

the coined portion of each of the leads of the first and second sets is exposed within the package body;

the first electrical subassembly is electrically connected to the land portions of the leads of the first set; and the second electrical subassembly is electrically connected to the land portions of the leads of the second set.

8. The memory card of claim 7 wherein the first and second electrical subassemblies each comprise:

a substrate defining opposed top and bottom surfaces and having a plurality of conductive traces which extend to the top surface and are adapted to route electrical signals to a plurality of terminal pads disposed on the bottom surface; and at least one electronic component disposed on the top surface and electrically connected to the conductive traces;

the terminal pads of the first electrical subassembly being electrically connected to respective ones of the land portions of the leads of the first set and the terminal pads of the second electrical subassembly being electrically connected to respective ones of the land portions of the leads of the second set.

9. The memory card of claim 8 wherein:

the land portions of the leads of the first set and the terminal pads of the first electrical subassembly are arranged in complementary patterns such that the terminal pads of the first electrical subassembly are placed into direct, electrical contact with respective ones of the land portions of the leads of the first set; and the land portions of the leads of the second set and the terminal pads of the second electrical subassembly are arranged in complementary patterns such that the terminal pads of the second electrical subassembly are placed into direct, electrical contact with respective ones of the land portions of the leads of the second set.

10. A memory card, comprising:

a leadframe including a multiplicity of leads which each define:
   a proximal end;
   a distal end disposed in opposed relation to the proximal end; and
   a pair of coined portions disposed between the proximal and distal ends;
   each of the leads being shaped in a manner wherein the coined portions are disposed in vertical registry with each other and the proximal and distal ends are disposed in juxtaposed relation to each other;

a substrate defining opposed top and bottom surfaces and including conductive traces which extend to each of the top and bottom surfaces thereof;

the distal ends of the leads being electrically connected to the conductive traces extending to the top surface of the substrate and the proximal ends of the leads being electrically connected to the conductive traces extending to the bottom surface of the substrate.

11. The memory card of claim 10 wherein a portion of the substrate is advanced between the proximal and distal ends of each of the leads.

12. A memory card, comprising:
a leadframe including a multiplicity of leads which each define:
  a proximal end;
  a distal end disposed in opposed relation to the proximal end; and
  a pair of coined portions disposed between the proximal and distal ends;
  each of the leads being shaped in a manner wherein the coined portions are disposed in vertical registry with each other and the distal end extends toward a portion of the lead adjacent the proximal end;
a substrate defining opposed top and bottom surfaces and including conductive traces which extend to each of the top and bottom surfaces thereof;
the proximal ends of the leads being electrically connected to the conductive traces extending to the bottom surface of the substrate.

13. A semiconductor package, comprising:
a leadframe comprising:
  a first die pad;
  a first set of leads disposed about and extending toward the first die pad;
  a second die pad;
  a second set of leads disposed about and extending toward the second die pad;
certain ones of the leads of the first set being connected to respective ones of the leads of the second set, with the connected leads of the first and second sets being shaped such that the first and second die pads extend in spaced, generally parallel relation to each other;
a first semiconductor die attached to the first die pad and electrically connected to at least some of the leads of the first set;
a second semiconductor die attached to the second die pad and electrically connected to at least some of the leads of the second set; and
a package body at least partially encapsulating the leadframe and the first and second semiconductor dies.

14. The semiconductor package of claim 13 wherein the first and second semiconductor dies are electrically connected to at least some of the leads of the first and second sets which are connected to each other.

15. The semiconductor package of claim 13 wherein the first and second semiconductor dies are each disposed between the first and second die pads.

16. The semiconductor package of claim 13 wherein:
at least some of the leads of the first set are formed to have a gull-wing configuration defining a flared portion;
at least some of the leads of the second set are formed to have a thickened end portion; and
the package body is formed in a manner wherein the flared portions and end portions of the leads are partially exposed therein.

17. A memory card, comprising:
a leadframe including:
  a main frame;
  a first set of leads extending toward the main frame; and
  a second set of leads connected to the main frame and folded over a portion thereof so as to extend in juxtaposed relation to respective ones of the leads of the first set;
an electrical subassembly electrically connected to the leads of the first and second sets; and
a package body at least partially encapsulating the leadframe and the electrical subassembly.

18. A memory card, comprising:
a leadframe including:
  a main frame;
  a first set of leads extending toward the main frame; and
  a second set of leads connected to the main frame and folded over a portion thereof so as to extend in juxtaposed relation to respective ones of the leads of the first set, wherein each of the leads of the first and second sets defines a coined portion and a land portion;
an electrical subassembly electrically connected to the land portions of the leads of the first and second sets; and
a package body at least partially encapsulating the leadframe and the electrical subassembly, wherein the package body is formed such that the coined portions of the leads of the first and second sets are exposed therein.

19. A memory card, comprising:
a leadframe including:
  first and second main frames;
  a first set of leads extending toward the first main frame;
  a second set of leads extending toward the second main frame; and
  a third set of leads extending between the first and second main frames, the leads of the third set being folded in a manner wherein the first and second main frames extend in opposed, spaced relation to each other and the leads of the first set extend in spaced, vertical registry with respective ones of the leads of the second set;
a first electrical subassembly electrically connected to the leads of the first set;
a second electrical subassembly electrically connected to the leads of the second set; and
a package body at least partially encapsulating the leadframe and the first and second electrical subassemblies.

20. The memory card of claim 19 wherein:
each of the leads of the first and second sets defines a coined portion and a land portion;
the first electrical subassembly is electrically connected to the land portions of the leads of the first set;
the second electrical subassembly is electrically connected to the land portions of the leads of the second set; and
the package body is formed such that the coined portions of the leads of the first and second sets are exposed therein.

21. The memory card of claim 19 wherein the leads of the third set are folded in a manner wherein neither of the first and second subassemblies is disposed between the first and second main frames.

22. A semiconductor package, comprising:
a leadframe which includes:
  a first die pad;
  a first set of leads disposed about and extending toward the first die pad;
  a second die pad; and
  a second set of leads disposed about and extending toward the second die pad;
certain ones of the leads of the first set being connected to respective ones of the leads of the second set, the leads of the first and second sets which are connected to each other being bent in a manner wherein the first and second die pads extend in spaced, generally parallel relation to each other;

a first semiconductor die attached to the first die pad and electrically connected to at least some of the leads of the first set;

a second semiconductor die attached to the second die pad and electrically connected to at least some of the leads of the second set; and a package body encapsulating the leadframe and the first and second semiconductor dies, at least portions of the first and second leads being exposed in a common surface of the package body.

* * * * *